United States Patent
Chen et al.

(10) Patent No.: US 8,883,033 B2
(45) Date of Patent: Nov. 11, 2014

(54) METHOD FOR REMOVING NITRIDE MATERIAL

(71) Applicant: United Microelectronics Corp., Hsin-Chu (TW)

(72) Inventors: Chi-Sheng Chen, New Taipei (TW); Shin-Chi Chen, Penghu County (TW); Chih-Yueh Li, Taipei (TW); Ted Ming-Lang Guo, Tainan (TW); Bo-Syuan Lee, Tainan (TW); Tsung-Hsun Tsai, Chiayi County (TW); Yu-Chin Cheng, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/784,846

(22) Filed: Mar. 5, 2013

(65) Prior Publication Data
US 2014/0256151 A1    Sep. 11, 2014

(51) Int. Cl.
    *B44C 1/22*    (2006.01)
    *H01L 21/302*   (2006.01)
    *H01L 21/308*   (2006.01)

(52) U.S. Cl.
    CPC ................... *H01L 21/308* (2013.01)
    USPC .................. 216/99; 216/83; 216/96; 438/745; 438/749; 438/757

(58) Field of Classification Search
    USPC .................. 216/83, 96, 99; 438/745, 749, 757
    See application file for complete search history.

(56) References Cited

U.S. PATENT DOCUMENTS

| | | | |
|---|---|---|---|
| 6,245,681 B1 | 6/2001 | Shields | |
| 6,613,693 B1* | 9/2003 | Heo et al. | 438/745 |
| 6,740,248 B2* | 5/2004 | Li et al. | 216/99 |
| 6,758,940 B2* | 7/2004 | Chiu | 156/345.15 |
| 6,894,357 B2* | 5/2005 | Guo | 257/410 |
| 7,250,114 B2* | 7/2007 | Kiehlbauch et al. | 216/31 |
| 2013/0248949 A1* | 9/2013 | Kirkpatrick et al. | 257/288 |

* cited by examiner

*Primary Examiner* — Shamim Ahmed
(74) *Attorney, Agent, or Firm* — Winston Hsu; Scott Margo

(57) ABSTRACT

A method for removing silicon nitride material includes following steps. A substrate having at least a gate structure formed thereon is provided, and at least a silicon nitride hard mask is formed on top of the gate structure. A first removal is performed to remove a portion of the silicon nitride hard mask with a first phosphoric acid ($H_3PO_4$) solution. A second removal is subsequently performed to remove remnant silicon nitride hard mask with a second phosphoric acid solution. The first removal and the second removal are performed in-situ. A temperature of the second phosphoric acid solution is lower than a temperature of the first phosphoric acid solution.

15 Claims, 4 Drawing Sheets

METHOD FOR REMOVING NITRIDE MATERIAL

BACKGROUND OF THE INVENTION

1. Field of the Invention

The invention relates to a method for removing nitride material, and more particularly, to a method for removing silicon nitride.

2. Description of the Prior Art

Nitride material, particularly silicon nitride, is prevalently used in semiconductor device fabrication for serving as mask that providing obstruction and protection, insulating structure that providing electrical isolation, and even serving as stress structure that providing stress and thus improving carrier mobility of transistor device. Therefore, it is extremely important to form a silicon nitride film or structure of superior uniformity, to etch or pattern a silicon film/structure having high structural strength and thus to obtain the required device pattern in following process such as etching process or ion implantation, and to remove the hard silicon nitride film/structure without damaging other device components/elements.

SUMMARY OF THE INVENTION

According to the claimed invention, a method for removing silicon nitride material is provided. The method first provides a substrate having at least a silicon nitride layer formed thereon. Then, a first removal is performed to remove a portion of the silicon nitride layer with a first phosphoric acid ($H_3PO_4$) solution. Subsequently, a second removal is performed to remove remnant silicon nitride layer with a second $H_3PO_4$ solution. A temperature of the second $H_3PO_4$ solution is lower than a temperature of the first $H_3PO_4$ solution. A process duration of the second removal is longer than a process duration of the first removal.

According to the claimed invention, another method for removing silicon nitride material is provided. The method first provides a substrate having at least a gate structure formed thereon. And the gate structure includes at least a silicon nitride hard mask formed thereon. Then, a first removal is performed to remove a portion of the silicon nitride hard mask with a first $H_3PO_4$ solution. Subsequently, a second removal is performed to remove remnant silicon nitride hard mask with a second $H_3PO_4$ solution. The first removal and the second removal are performed in-situ. A temperature of the second $H_3PO_4$ solution is lower than a temperature of the first $H_3PO_4$ solution.

According to the method for removing silicon nitride material provided by the present invention, the first removal is performed with the first $H_3PO_4$ solution of relative higher temperature in the shorter process duration, therefore a portion of the silicon nitride material is removed. Then, the second removal is performed to remove the remnant silicon nitride material with the second $H_3PO_4$ solution of relative lower temperature in the longer process duration. Since etching selectivity of the low-temperature $H_3PO_4$ solution is higher than that of the high-temperature $H_3PO_4$ solution, the second removal is performed to remove the remnant silicon nitride without damaging or consuming other materials or elements. Furthermore, since the process duration of the second removal is longer than that of the first removal, the silicon nitride material is efficaciously removed without impacting other elements.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-4 are schematic drawings illustrating the method for removing silicon nitride material according to a first preferred embodiment of the present invention, wherein FIG. 3 is a schematic drawing in a step subsequent to FIG. 2, and FIG. 4 is a schematic drawing in a step subsequent to FIG. 3.

FIGS. 5-7 are schematic drawings illustrating the method for removing silicon nitride material according to a second preferred embodiment of the present invention, wherein FIG. 6 is a schematic drawing in a step subsequent to FIGS. 5, and FIG. 7 is a schematic drawing in a step subsequent to FIG. 6.

DETAILED DESCRIPTION

Figure 1:
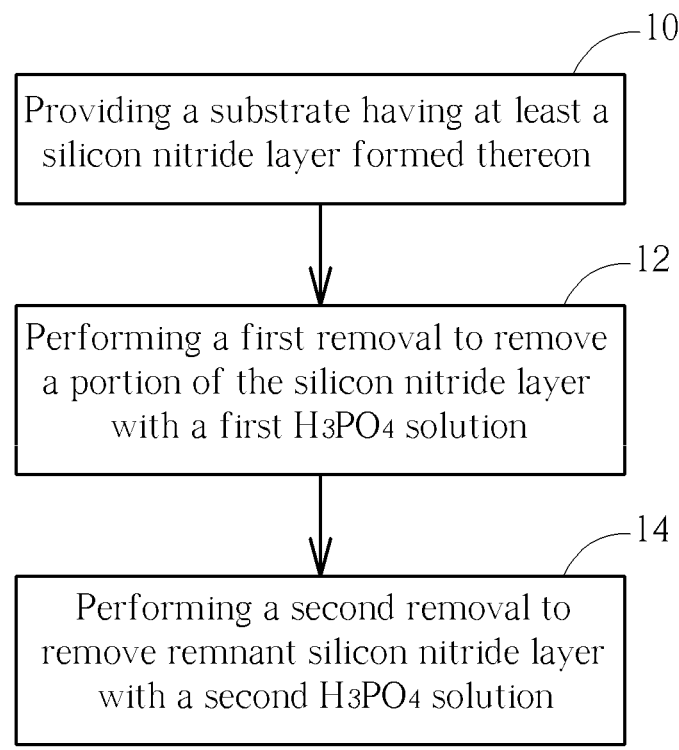
FIG. 1 is a flow chart illustrating a method for removing silicon nitride material provided by the present invention.
Figure 2:
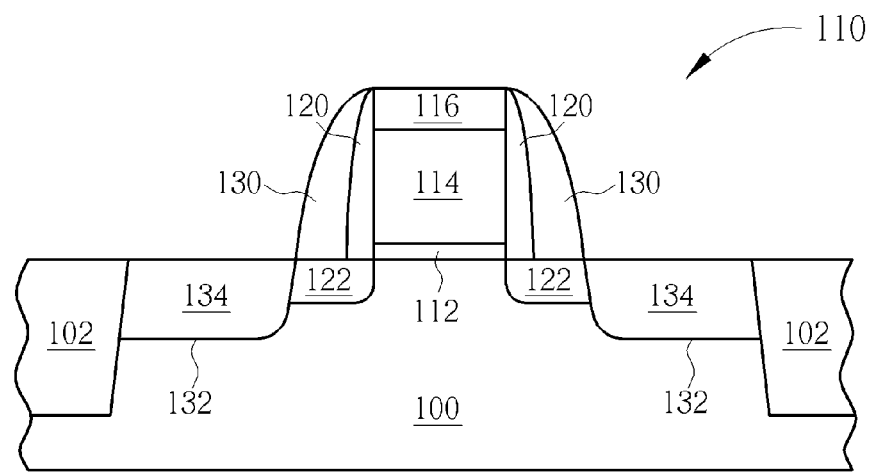
Figure 3:
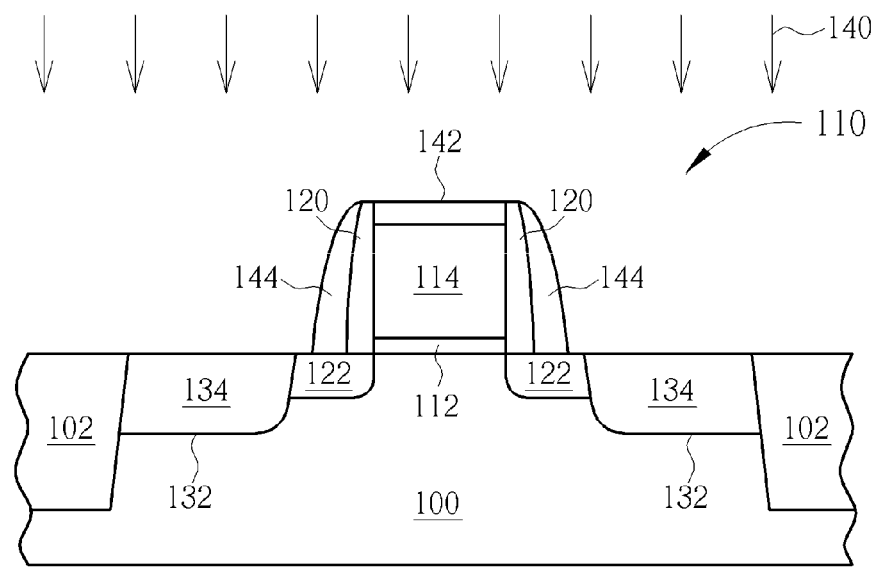
Figure 4:
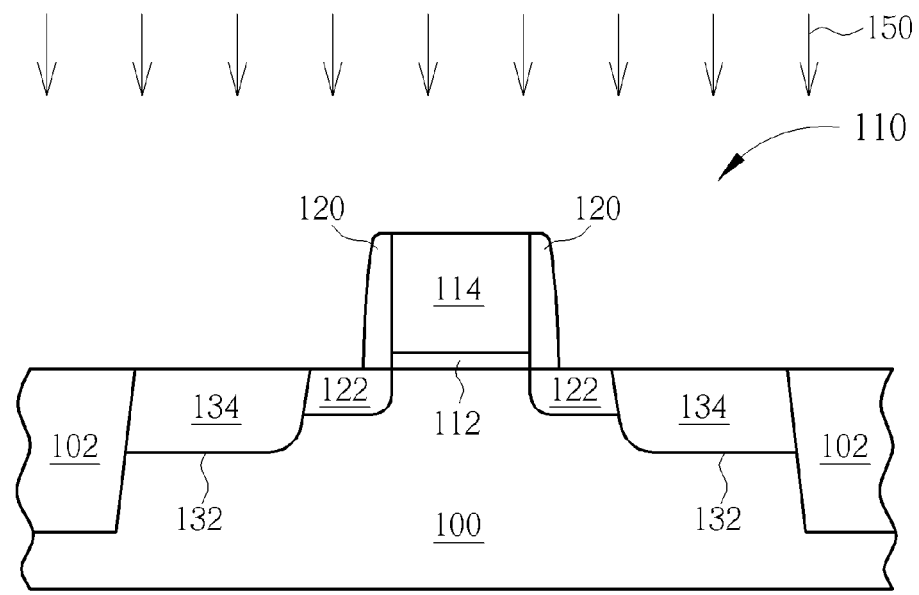

Please refer to FIG. 1 and FIGS, 2-4, wherein FIG. 1 is a flow chart illustrating a method for removing silicon nitride material provided by the present invention, and FIGS. 2-4 are schematic drawings illustrating the method for removing silicon nitride material according to a first preferred embodiment of the present invention. As shown in FIG. 1, the present invention provides:

STEP 10: providing a substrate having at least a silicon nitride layer formed thereon.

As shown in FIG. 2, the preferred embodiment provides a substrate 100, and the substrate 100 can include p-wells and/or n-wells which are required by different semiconductor devices. A plurality of isolation structures 102 such as field oxide (FOX) structure or shallow trench isolation (STI) structure is formed in the substrate 100 for providing electrical isolation between n-doped regions and/or p-doped regions. At least a gate structure 110 is formed on the substrate 100. The gate structure 110 includes a gate dielectric layer 112, a gate electrode 114, and a silicon nitride hard mask 116 upwardly and sequentially stacked on the substrate 100. It is well-known to those skilled in the art that the silicon nitride hard mask 116, which is disposed on the gate electrode 114, protects the gate electrode 114 from damages or consumption in following process such as photolithography process, ion implantation, etching process, and even cleaning process.

Please still refer to FIG. 2. A first spacer 120 is formed on sidewalls of the gate structure 110, and lightly-doped drains (LDDs) 122 are formed in the substrate 100 at two sides of the gate structure 110. The first spacer 120 can be single layer or a multi layer. The first spacer 120 protects the sidewalls of the gate structure 110 in following process and is used to define locations where a source/drain is to be formed. According to the preferred embodiment, the first spacer 120 includes material different from silicon nitride. For example but not limited to, the first spacer 120 in the preferred embodiment includes silicon oxide.

Please still refer to FIG. 2. In the preferred embodiment, a silicon nitride disposal spacer 130 can be formed to cover the first spacer 120 on the sidewalls of the gate structure 110. In other words, the first spacer 120 is sandwiched between the sidewalls of the gate structure 110 and the silicon nitride disposal spacer 130. Next, an etching process (not shown) is performed to etch the substrate 100 at two sides of the gate structure 110, particularly, at two sides of the silicon nitride disposal spacer 130. Thus, a recess 132 is formed at respective sides of the gate structure 110 according to the preferred embodiment. In the etching process, the silicon nitride hard mask 116 and the silicon nitride disposal spacer 130 serve as etching masks and protect the profile of the gate structure 110.

Please still refer to FIG. 2. According to the preferred embodiment, a selective epitaxial growth (SEG) method is performed to form an epitaxial layer respectively in the recess 132. Specifically, the recess 132 is filled up with the epitaxial layer. When the epitaxial layer is an element for a pMOS transistor, it includes semiconductor materials of which the lattice constant is larger than the lattice constant of silicon, such as germanium. When the epitaxial layer is an element for an nMOS transistor, it includes semiconductor materials of which the lattice constant is smaller than the lattice constant of silicon, such as carbon. In other words, the epitaxial layer can include SiGe or SiC depending on the requirements to different conductivity types. In addition, dopants can be doped into the epitaxial layers before, during, or after the SEG method, and thus an epitaxial source/drain 134 is obtained. Top surfaces of the epitaxial layers can be higher than the surface of the substrate 100. In other words, a raised epitaxial source/drain 134 can be obtained.

Please refer to FIG. 1 again. The present invention then provides:

STEP 12: Performing a first removal to remove a portion of the silicon nitride layer with a first $H_3PO_4$ solution.

Please refer to FIG. 3. A first removal is performed with a first $H_3PO_4$ solution 140 in accordance with the present invention. In the preferred embodiment, a temperature of the first $H_3PO_4$ solution 140 is higher than 150° C. It should be noted that a comparison is provided in the preferred embodiment. In the comparison, the silicon nitride material is removed by a comparison $H_3PO_4$ solution having concentration and temperature identical to the first $H_3PO_4$ solution 140. In the preferred embodiment, a process duration of the first removal is no longer than a half of a process duration of the comparison. For example, when the process duration of the comparison is 660 seconds, the process duration of the first removal is 330 seconds. Since the temperatures and concentrations of the comparison $H_3PO_4$ solution and the first $H_3PO_4$ solution 140 are identical, those skilled in the art will easily realize that the comparison $H_3PO_4$ solution and the first $H_3PO_4$ solution 140 have the same silicon nitride etching rates. Therefore, when the process duration of the first removal is a half of the process duration of the comparison as exemplarily mentioned, the silicon nitride material removed by the first $H_3PO_4$ solution 140 is only a half of the silicon nitride material removed by the comparison $H_3PO_4$ solution. It is also noticeable that the first $H_3PO_4$ solution 140 having temperature higher than 150° C. suffers lower etching selectivity between silicon nitride and other material such silicon oxide, therefore a portion of the first spacer 120 is removed in the first removal. Consequently, as shown in FIG. 3, a remnant silicon nitride hard mask 142, a remnant silicon nitride disposal spacer 144 and the first spacer 120 partially removed are obtained after the first removal.

Please refer to FIG. 1 again. The present invention then provides:

STEP 14: Performing a second removal to remove remnant silicon nitride layer with a second $H_3PO_4$ solution.

Please refer to FIG. 4. A second removal is performed with a second $H_3PO_4$ solution 150 in accordance with the present invention. It is noteworthy that the first removal and the second removal are performed ex-situ or in-situ. It is well-known to those skilled in the art that "in-situ etching" means the etching processes are performed in different tanks of one same etching apparatus/tool, or means two etching recipes in a single wafer processing apparatus. In the preferred embodiment, a concentration of the second $H_3PO_4$ solution 150 is the same with the concentration of the first $H_3PO_4$ solution 140, but a temperature of the second $H_3PO_4$ solution 150 is lower than 120° C. It is also noteworthy that since the concentration of the second $H_3PO_4$ solution 150 is the same with the concentration of the first $H_3PO_4$ solution 140 but the temperature of the second $H_3PO_4$ solution 150 is lower than the first $H_3PO_4$ solution 140, the silicon nitride etching rate of the second $H_3PO_4$ solution 150 is lower than the silicon nitride etching rate of the first $H_3PO_4$ solution 140. However, the etching selectivity of the second $H_3PO_4$ solution 150 between silicon nitride and other material is higher than the first $H_3PO_4$ solution 140. According to the preferred embodiment, a process duration of the second removal is longer than the process duration of the first removal to complete the removal for the remnant silicon nitride hard mask 142 and the remnant silicon nitride disposal spacer 144. For example, it is observed that the silicon nitride etching rate of the second $H_3PO_4$ solution 150 of relative low-temperature is one-quarter to the silicon nitride etching rate of the first $H_3PO_4$ solution 140 of relative high-temperature, therefore the process duration of the first removal and the process duration of the second removal have a ratio, and the ratio is lower than 1:4. For example, when the process duration of the first removal is 330 seconds as mentioned above, the process duration of the second removal is at least four times to the first removal, that is 1320 seconds, but not limited to this. Accordingly, the overall process duration of the first removal and the second removal, which is 1650 seconds, is longer than the process duration of the comparison, which is 660 seconds. As shown in FIG. 4, since the process duration of the second removal is longer, the remnant silicon nitride hard mask 142 and the remnant silicon nitride disposal spacer 144, even a portion of the first spacer 120 exposed on the top of the gate structure 110 are removed though the second $H_3PO_4$ solution 150 includes lower silicon nitride etching rate. Furthermore, the etching selectivity of the lower-temperature second $H_3PO_4$ solution 150 between silicon nitride and other material is higher than that of the higher-temperature first $H_3PO_4$ solution 140, therefore the second removal spontaneously stops at the top of the gate electrode 114 and the first spacer 120 after removing the remnant silicon nitride hard mask 142 and the remnant silicon nitride disposal spacer 144. Accordingly, the top of the gate electrode 114 and a portion of the epitaxial source/drain 134 are exposed. Subsequent to removing the remnant silicon nitride hard mask 142 and the remnant silicon nitride disposal spacer 144, any required process such as forming a second spacer (not shown) and forming salicide on the source/drain 134 after forming the second spacer are performed according to the preferred embodiment.

According to the method for removing silicon nitride material provided by the first preferred embodiment, two-stepped removal is performed with $H_3PO_4$ solutions having identical concentrations but different temperatures: the shorter first removal is performed with the high-temperature first $H_3PO_4$ solution 140 and the longer second removal is performed with the low-temperature second $H_3PO_4$ solution 150. As mentioned above, the etching selectivity of the low-temperature second $H_3PO_4$ solution 150 is higher than the etching selectivity of the high-temperature first $H_3PO_4$ solution 140, and the process duration of the second removal is longer than the process of the first removal, therefore the silicon nitride is removed without consuming other material or elements. Consequently, process window of any subsequent processes such as forming the second spacer, forming the salicide, and even forming contact holes in the interlayer dielectric (ILD) layer is efficaciously improved.

Figure 5:
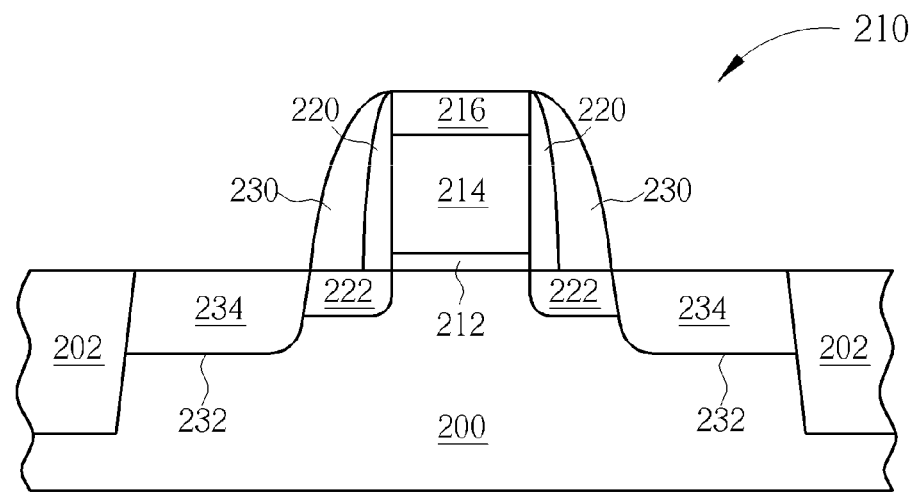
Figure 6:
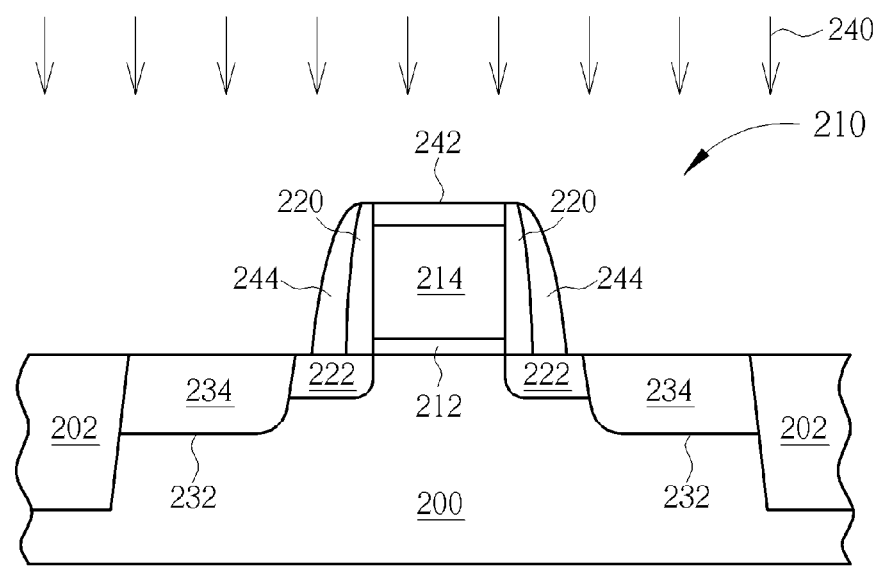
Figure 7:
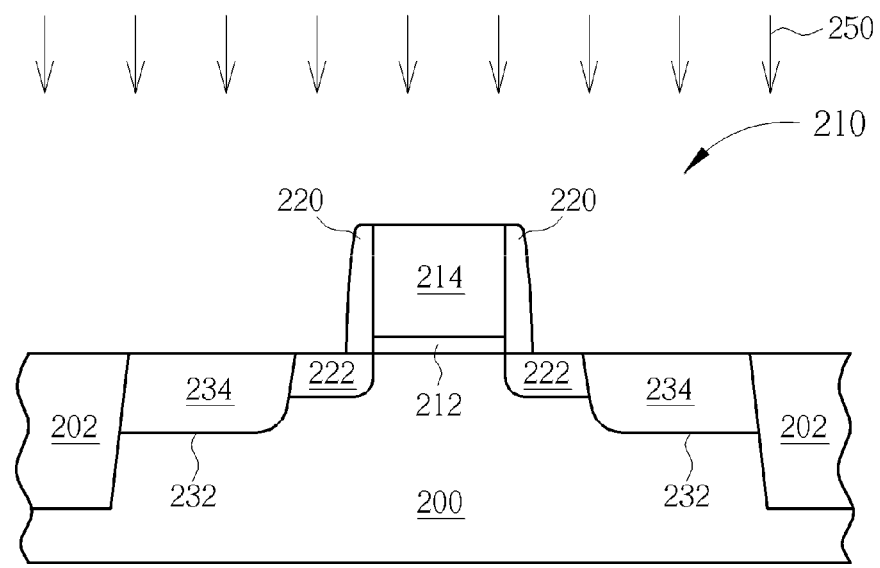

Please refer to FIG. 1 and FIGS. 5-7, wherein FIGS. 5-7 are schematic drawings illustrating the method for removing silicon nitride material according to a second preferred embodiment of the present invention. It should be noted that elements the same in both first and second embodiments can be made of the same materials, therefore those details are omitted herein in the interest of brevity. As shown in FIGS. 1 and 5, STEP 10 is performed by providing a substrate 200. The substrate 200 can include p-wells and/or n-wells which are required by different semiconductor devices. A plurality of isolation structures 202 such as field oxide structure or shallow trench isolation structure is formed in the substrate 200 for providing electrical isolation between n-doped regions and/or p-doped regions. At least a gate structure 210 is formed on the substrate 200. The gate structure 210 includes a gate dielectric layer 212, a gate electrode 214, and a silicon nitride hard mask 216 upwardly and sequentially stacked on the substrate 200. A first spacer 220 is formed on sidewalls of the gate structure 210, and LDDs 222 are formed in the substrate 200 at two sides of the gate structure 210. According to the preferred embodiment, the first spacer 220 includes material different from silicon nitride. A silicon nitride disposal spacer 230 can be formed to cover the first spacer 220 on the sidewalls of the gate structure 210 in accordance with the preferred embodiment. In other words, the first spacer 220 is sandwiched between the sidewalls of the gate structure 210 and the silicon nitride disposal spacer 230. Next, an etching process (not shown) is performed to etch the substrate 200 at two sides of the gate structure 210, particularly, at two sides of the silicon nitride disposal spacer 230. Thus, a recess 232 is formed at respective sides of the gate structure 210 according to the preferred embodiment. Subsequently, a SEG method is performed to form an epitaxial layer respectively in the recess 232 for serving as an epitaxial source/drain 234. Specifically, the recess 232 is filled up with the epitaxial layer.

Please refer to FIG. 1 and FIG. 6. Next, STEP 12 is performed. Accordingly, a first removal is performed to remove silicon nitride materials with a first $H_3PO_4$ solution 240. In the preferred embodiment, a temperature of the first $H_3PO_4$ solution 240 is higher than 150° C. It should be noted that a comparison is provided in the preferred embodiment. In the comparison, the silicon nitride material is removed by a comparison $H_3PO_4$ solution having concentration and temperature identical to the first $H_3PO_4$ solution 240. In the preferred embodiment, a process duration of the first removal is no longer than one-third of a process duration of the comparison. For example, when the process duration of the comparison is 660 seconds, the process duration of the first removal is 220 seconds. Since the temperatures and concentrations of the comparison $H_3PO_4$ solution and the first $H_3PO_4$ solution 240 are identical, those skilled in the art will easily realize that the comparison $H_3PO_4$ solution and the first $H_3PO_4$ solution 240 have the same silicon nitride etching rates. Therefore, when the process duration of the first removal is one-third of the process duration of the comparison as exemplarily mentioned, the silicon nitride material removed by the first $H_3PO_4$ solution 240 is only one-third of the silicon nitride material removed by the comparison $H_3PO_4$ solution. It is also noticeable that the first $H_3PO_4$ solution 240 having temperature higher than 150° C. suffers lower etching selectivity between silicon nitride and other material such silicon oxide, therefore a portion of the first spacer 220 is removed in the first removal. Consequently, as shown in FIG. 6, a remnant silicon nitride hard mask 242, a remnant silicon nitride disposal spacer 244 and the first spacer 220 partially removed are obtained after the first removal.

Please refer to FIG. 1 and FIG. 7. Next, STEP 14 is performed. Accordingly, a second removal is performed to remove silicon nitride materials with a second $H_3PO_4$ solution 250 in accordance with the present invention. It is noteworthy that the first removal and the second removal are performed in-situ.

In the preferred embodiment, a concentration of the second $H_3PO_4$ solution 250 is the same with the concentration of the first $H_3PO_4$ solution 240, but a temperature of the second $H_3PO_4$ solution 250 is lower than 120° C. As mentioned above, since the concentration of the second $H_3PO_4$ solution 250 is the same with the concentration of the first $H_3PO_4$ solution 240 but the temperature of the second $H_3PO_4$ solution 250 is lower than the first $H_3PO_4$ solution 240, the silicon nitride etching rate of the second $H_3PO_4$ solution 250 is lower than the silicon nitride etching rate of the first $H_3PO_4$ solution 240. However, the etching selectivity of the second $H_3PO_4$ solution 250 between silicon nitride and other material is higher than that of the first $H_3PO_4$ solution 240. According to the preferred embodiment, a process duration of the second removal is longer than the process duration of the first removal to complete the removal for the remnant silicon nitride hard mask 242 and the remnant silicon nitride disposal spacer 244. It should be noted that the process duration of the first removal in the second preferred embodiment is shorter than the process duration of the first removal in the first preferred embodiment, therefore the process duration of the second removal is further prolonged. For example, the process duration of the first removal and the process duration of the second removal have a ratio, and the ratio is lower than 1:4, preferably lower than 1:8. In one example, when the process duration of the first removal is 220 seconds as mentioned above, the process duration of the second removal is at least eight times to the first removal, that is 1760 seconds, but not limited to this. Accordingly, the overall process duration of the first removal and the second removal, which is 1980 seconds, is longer than the process duration of the comparison, which is 660 seconds. As shown in FIG. 7, since the process duration of the second removal is longer, the remnant silicon nitride hard mask 242 and the remnant silicon nitride disposal spacer 244, even a portion of the first spacer 220 exposed on the top of the gate structure 210 are removed though the second $H_3PO_4$ solution 250 includes lower etching rate to silicon nitride. Furthermore, the etching selectivity of the lower-temperature second $H_3PO_4$ solution 250 between silicon nitride and other material is higher than that of the higher-temperature first $H_3PO_4$ solution 240, therefore the second removal spontaneously stops at the top of the gate electrode 214 and the first spacer 220 after removing the remnant silicon nitride hard mask 242 and the remnant silicon nitride disposal spacer 244. Accordingly, the top of the gate electrode 214 and a portion of the epitaxial source/drain 234 are exposed. Subsequent to removing the remnant silicon nitride hard mask 242 and the remnant silicon nitride disposal spacer 244, any required process such as forming a second spacer (not shown) and forming salicide on the source/drain 234 after forming the second spacer are performed according to the preferred embodiment.

According to the method for removing silicon nitride material provided by the second preferred embodiment, two-stepped removal is performed with $H_3PO_4$ solutions having identical concentrations but different temperatures: the shorter first removal is performed with the high-temperature first $H_3PO_4$ solution 240 and the longer second removal is performed with the low-temperature second $H_3PO_4$ solution 250. As mentioned above, the etching selectivity of the low-temperature second $H_3PO_4$ solution 250 is higher than the etching selectivity of the high-temperature first $H_3PO_4$ solution 240, and the process duration of the second removal is longer than the process of the first removal, therefore the silicon nitride is removed without consuming other material or elements. Consequently, process window of any subsequent processes such as forming the second spacer, forming the salicide, and forming contact holes in the interlayer dielectric layer is efficaciously improved.

According to the method for removing silicon nitride material provided by the present invention, the first removal is performed with the first $H_3PO_4$ solution of relative higher temperature in shorter process duration, therefore a portion of the silicon nitride material is removed. Then, the second removal is performed to remove the remnant silicon nitride material with the second $H_3PO_4$ solution of relative lower temperature in longer process duration. It is noteworthy that the process duration of the first removal is no longer than a half of the conventional process, such as the aforementioned comparison, in which the silicon nitride material is removed by the $H_3PO_4$ solution having the concentration and temperature identical to the first $H_3PO_4$ solution. Since etching selectivity of the low-temperature $H_3PO_4$ solution is higher than that of the high-temperature $H_3PO_4$ solution, the second removal is performed to remove the remnant silicon nitride without damaging or consuming other materials or elements. Furthermore, since the process duration of the second removal is longer than that of the first removal, the silicon nitride material can be removed without impacting other elements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for removing silicon nitride material comprising:
   providing a substrate having at least a silicon nitride layer formed thereon;
   performing a first removal to remove a portion of the silicon nitride layer with a first phosphoric acid ($H_3PO_4$) solution; and
   performing a second removal to remove remnant silicon nitride layer with a second $H_3PO_4$ solution, a temperature of the second $H_3PO_4$ solution is lower than a temperature of the first $H_3PO_4$ solution, a process duration of the second removal is longer than a process duration of the first removal, and a concentration of the first $H_3PO_4$ solution and a concentration of the second $H_3PO_4$ solution are identical.

2. The method for removing silicon nitride material according to claim 1, wherein the first removal and the second removal are performed in-situ.

3. The method for removing silicon nitride material according to claim 1, wherein the first removal and the second removal are performed ex-situ.

4. The method for removing silicon nitride material according to claim 1, wherein the temperature of the first $H_3PO_4$ solution is higher than 150° C. and the temperature of the second $H_3PO_4$ solution is lower than 120° C.

5. The method for removing silicon nitride material according to claim 1, wherein the process duration of the first removal and the process duration of the second removal have a ratio, and the ratio is lower than 1:4.

6. A method for removing silicon nitride material, comprising:
   providing a substrate having at least a gate structure formed thereon, and the gate structure comprising at least a silicon nitride hard mask formed thereon;
   performing a first removal to remove a portion of the silicon nitride hard mask with a first $H_3PO_4$ solution; and
   performing a second removal to remove remnant silicon nitride hard mask with a second $H_3PO_4$ solution, the first removal and the second removal being performed in-situ, a temperature of the second $H_3PO_4$ solution is lower than a temperature of the first $H_3PO_4$ solution, and a concentration of the first $H_3PO_4$ solution and a concentration of the second $H_3PO_4$ solution are identical.

7. The method for removing silicon nitride material according to claim 6, wherein the temperature of the first $H_3PO_4$ solution is higher than 150° and the temperature of the second $H_3PO_4$ solution is lower than 120° C.

8. The method for removing silicon nitride material according to claim 7 wherein a process duration of the first removal is longer than a process duration of the second removal.

9. The method for removing silicon nitride material according to claim 8, wherein the process duration of the first removal and the process duration of the second removal have a ratio, and the ratio is lower than 1:4.

10. The method for removing silicon nitride material according to claim 6, wherein a silicon nitride disposal spacer is formed on sidewalls of the gate structure.

11. The method for removing silicon nitride material according to claim 10, wherein an epitaxial source/drain is formed in the substrate at respective sides of the gate structure.

12. The method for removing silicon nitride material according to claim 10, wherein the first removal is performed to remove a portion of the silicon nitride disposal spacer, and the second removal is performed to remove remnant silicon nitride disposal spacer.

13. The method for removing silicon nitride material according to claim 12, wherein the gate structure further comprises a first spacer sandwiched between the silicon nitride disposal spacer and the sidewalls of the gate structure.

14. The method for removing silicon nitride material according to claim 13, wherein the first spacer comprises materials different from silicon nitride.

15. The method for removing silicon nitride material according to claim 14, wherein the second removal spontaneously stops at the first spacer.

* * * * *